United States Patent [19]
Strolle et al.

[11] Patent Number: 5,799,037
[45] Date of Patent: Aug. 25, 1998

[54] RECEIVER CAPABLE OF DEMODULATING MULTIPLE DIGITAL MODULATION FORMATS

[75] Inventors: Christopher H. Strolle, Montgomery, Pa.; Steven T. Jaffe, Monmouth, N.J.

[73] Assignee: David Sarnoff Research Center Inc., Princeton, N.J.

[21] Appl. No.: 721,663

[22] Filed: Sep. 27, 1996

Related U.S. Application Data

[63] Continuation-in-part of Ser. No. 602,943, Feb. 16, 1996.
[51] Int. Cl.⁶ .................. H03H 7/30; H04L 27/14
[52] U.S. Cl. .................. 375/233; 375/326
[58] Field of Search ............... 375/232–235, 375/321, 324–327, 332, 343, 346, 350, 371, 373; 348/725–726; 329/304, 307, 356–357

[56] References Cited

U.S. PATENT DOCUMENTS

| | | | |
|---|---|---|---|
| 4,286,283 | 8/1981 | Clemens | 348/454 |
| 4,422,175 | 12/1983 | Bingham et al. | 375/232 |
| 4,620,159 | 10/1986 | Yoshida et al. | 329/309 |
| 4,730,345 | 3/1988 | Reeve, III | 375/321 |
| 4,985,900 | 1/1991 | Rhind et al. | 375/226 |
| 5,228,060 | 7/1993 | Uchiyama | 375/224 X |
| 5,282,019 | 1/1994 | Basile et al. | 348/488 |
| 5,287,180 | 2/1994 | White | 348/484 |
| 5,311,546 | 5/1994 | Paik et al. | 375/232 |
| 5,315,619 | 5/1994 | Bhatt | 375/340 |
| 5,386,239 | 1/1995 | Wang et al. | 348/472 |
| 5,418,815 | 5/1995 | Ishikawa et al. | 375/216 |
| 5,471,508 | 11/1995 | Koslov | 375/344 |
| 5,477,199 | 12/1995 | Montreuil | 332/103 |
| 5,506,636 | 4/1996 | Patel et al. | 348/725 |
| 5,550,596 | 8/1996 | Strolle et al. | 348/607 |
| 5,581,585 | 12/1996 | Takatori et al. | 375/376 |
| 5,604,741 | 2/1997 | Samueli et al. | 370/402 |
| 5,627,885 | 5/1997 | Paneth et al. | 379/93 |
| 5,661,528 | 8/1997 | Han | 348/607 |
| 5,675,612 | 10/1997 | Solve et al. | 375/326 |

*Primary Examiner*—Young T. Tse
*Attorney, Agent, or Firm*—William J. Burke

[57] ABSTRACT

A receiver for demodulating multiple digital modulation formats including vestigial sideband (VSB), quadrature amplitude modulation (QAM), and offset QAM (OQAM). The receiver includes a timing recovery circuit that produces accurate timing information for each modulation format and a signal processor for adaptive equalization and quantization of each modulation format. The adaptive equalizer is a passband equalizer that performs blind equalization using a feed forward equalizer and a decision feedback equalizer.

20 Claims, 7 Drawing Sheets

5,799,037

RECEIVER CAPABLE OF DEMODULATING MULTIPLE DIGITAL MODULATION FORMATS

The present application is a continuation-in-part patent application of patent application Ser. No. 08/602,943, filed Feb. 16, 1996.

BACKGROUND OF THE DISCLOSURE

The present invention relates to a receiver which may be used to receive digital signals modulated in either vestigial sideband (VSB), quadrature amplitude modulation (QAM), offset QAM, or other similar digital modulation formats.

Digital data transmission is becoming more and more important to the electronic communications industry. In a digital data transmission system, a transmitted digital signal contains a sequence of encoded symbols each of which represents a predetermined number of data bits in the digital signal. One known method for coding such symbols is QAM, in which successive groups of bits (e.g. six or seven bits) are encoded into corresponding symbols. Each such symbol is represented by a complex signal, including an in-phase (or real) component I, and a quadrature (or imaginary) component Q. The value of this complex signal is one of a corresponding number (e.g., 64 or 128, respectively) of predetermined locations on the complex plane, called a constellation. This complex signal is then modulated onto the RF carrier. Other coding methods are known, including digital vestigial sideband (VSB) modulation, staggered QAM modulation, and quadrature phase shift keyed (QPSK) modulation. Digital signal receivers must be capable of receiving a digital signal, as described above, processing that signal, and reproducing the information represented by that signal, or storing that signal, e.g. on a magnetic tape, for reproduction at a later time. For example, television signals transmitted as a digital signal will soon supplement, and eventually replace, the analog television signals transmitted today. Television receivers will have to be able to receive digitally transmitted signals in any of the possible formats described above.

Each signal format has special requirements for timing and carrier recovery, signal acquisition and equalization, and baseband demodulation. Consequently, the prior art teaches techniques that demodulate one or, at most, two of the various signal formats within a single receiver. However, these receivers typically contain two demodulator in one housing, where each demodulator independently demodulates one of the signal formats. Such bifurcated demodulation requires an inordinate amount of costly circuitry.

Therefore, there is a need in the art for a receiver that demodulates a plurality of signal formats using common circuitry.

SUMMARY OF THE INVENTION

The disadvantages heretofore associated with the prior art are overcome by the present invention of a multiple digital modulation format receiver. The receiver contains a RF/IF front end, a demodulator, and a signal processor that are capable of handling multiple digital modulation formats including QAM, OQAM, VSB and the like. More specifically, the receiver contains an RF/IF front end that is coupled to an antenna, satellite dish and down converter, cable network or some other source of digital signals. The front end selects a particular channel from a plurality of available channels for demodulation and downconverts the modulated signal to form a near-baseband IF signal. The demodulator is coupled to the RF/IF front end and is further responsive to a sample clock signal. The sample clock signal is derived using timing recovery circuitry within the demodulator that derives an accurate clock signal from a variety of modulation formats. The universal timing recovery circuitry uses a matched filter/complement to match filter the quadrature data as well as provide a timing recovery signal. The timing recovery signal is produced by a band edge filter having a passband that is the compliment of the matched filter. This timing recovery signal is used to lock a VCXO such that the near baseband IF signals are synchronously sampled by an analog-to-digital converter. The demodulator ultimately produces symbol information at the output of the matched filter.

In lieu of a timing recovery circuit to produce a sample clock signal, the digitization could be accomplished using a free running oscillator and the digital signal can be interpolated thereafter.

The symbol information is processed in the signal processor that contains a passband adaptive equalizer and quantizer. The adaptive equalizer contains a feed forward equalizer as well as a decision feedback equalizer which together functions to adaptively equalize symbols from multiple formats of digital modulation. The output of the quantizer is a series of quantized symbol values representing information carried by any digital television signal, e.g., QAM, VSB, or OQAM.

BRIEF DESCRIPTION OF THE DRAWINGS

The teachings of the present invention can be readily understood by considering the following detailed description in conjunction with the accompanying drawings, in which:

FIG. 12 depicts a detailed block diagram of the symbol retiming circuit of FIG. 7.

To facilitate understanding, identical reference numerals have been used, where possible, to designate identical elements that are common to the figures.

DETAILED DESCRIPTION

Figure 1:
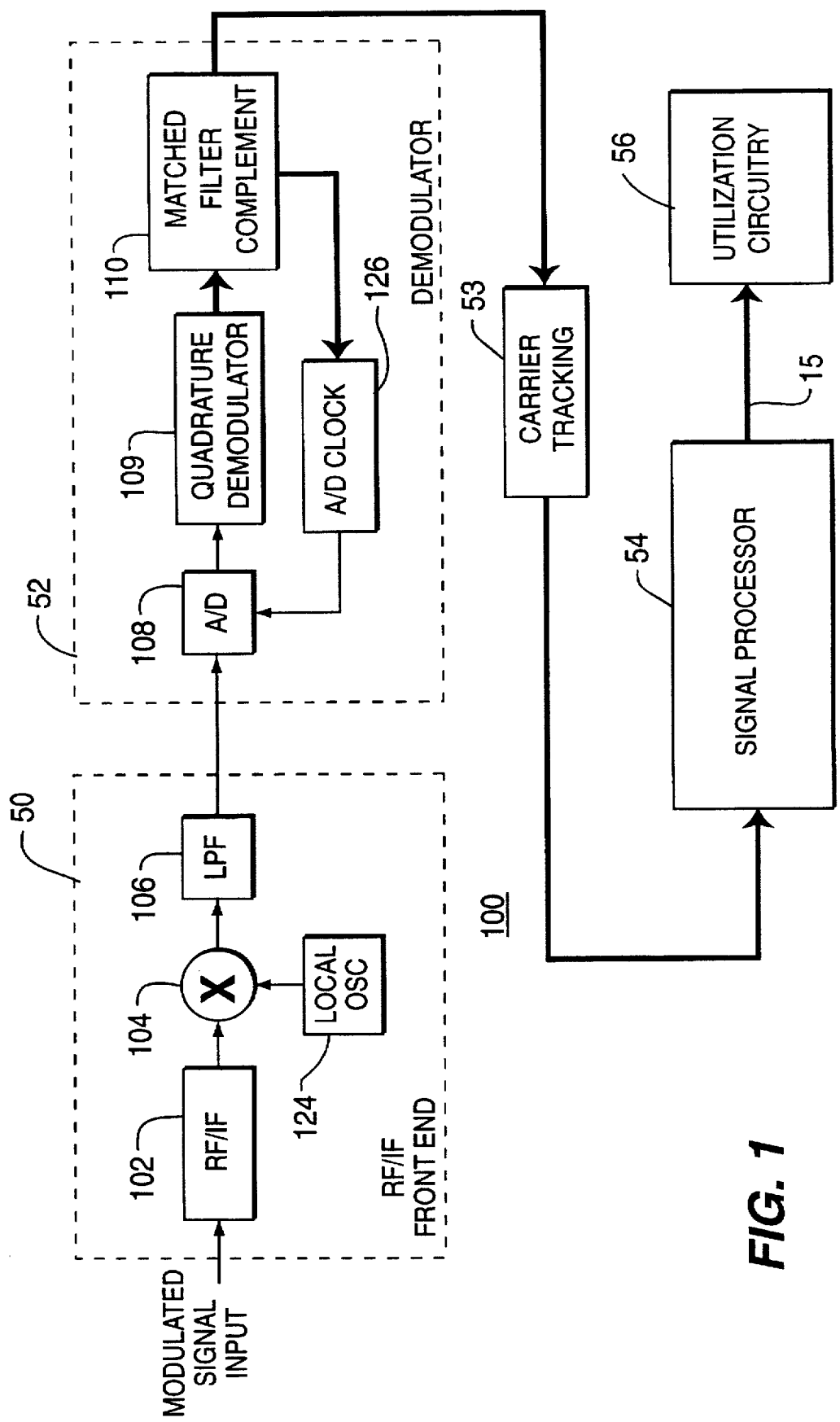
FIG. 1 is a block diagram of a digital television signal receiver according to principles of the present invention.

The present invention is a receiver capable of demodulating multiple digital modulation formats. Consequently, the present invention is applicable to any receiver in a digital transmission system transmitting modulated data in a digital format such as quadrature amplitude modulation (QAM), vestigial sideband modulation (VSB), offset QAM modulation (OQAM) and the like. One practical use for such a receiver is within a digital television transmission system, where the television receiver may be exposed to multiple digital modulation formats that carry the television information to the home. In the drawings, thin lines represent either real data signal paths, signals such as real signals, or control signals. Thick lines represent data signal paths carrying complex signals (i.e., in-phase and quadrature signals). The data signals may be analog or multibit digital signals. There are circuit elements in a digital modulation receiver in addition to those illustrated in the drawings, but these additional elements are generally application specific and not necessary to understand the present invention. As such, these elements have been omitted from the drawings for simplicity. One skilled in the art of digital modulation receiver design will understand what additional elements are necessary, and how to design, implement, and interconnect these additional elements with those illustrated in the drawings.

FIG. 1 is a block diagram of a digital modulation receiver 100 implemented according to principles of the present invention. The portion of the receiver depicted in FIG. 1 contains an RF/IF front-end 50, a demodulator 52, a carrier tracking circuit 53, a signal processor 54, and utilization circuitry 56. Important features of the invention are found in the A/D clock circuit 126 of the demodulator 52 and the equalization technique used in the signal processor 54. Specifically, the clock circuit 126 produces an accurate timing signal from multiple digital modulation signal formats, while the equalization technique is performed upon a passband signal and features both forward equalization and selective feedback equalization that operates on multiple digital modulation signals.

The RF/IF front end contains a radio frequency/ intermediate frequency (RF/IF) tuner 102 coupled to a source (not shown) of a digitally modulated signal (e.g., a QAM, OQAM or VSB signal) modulated on an RF carrier. The RF modulated digital signal source may, for example, be an antenna or a cable system. An output terminal of the RF/IF tuner 102 is coupled to a first input terminal of a mixer 104. A local oscillator 124 is coupled to a second input terminal of the mixer 104. An output terminal of the mixer 104 produces a near baseband signal that is coupled to an input terminal of a low pass filter (LPF) 106. Using a conventional channel selection and downconversion technique, the RF/IF front end 50 selects a channel with the tuner 102, downconverts the selected channel using the mixer 104, and low pass filters the downconverted signal to produce a near baseband IF signal.

An output terminal of the LPF 106 is coupled to a signal input terminal of an analog-to-digital converter (A/D) 108 within the demodulator 52. An output terminal of the A/D converter 108 is coupled to an input terminal of a quadrature demodulator 109. The A/D converter 108 converts the analog near baseband signal into a sequence of multibit digital samples representing the modulated signal. The frequency and phase of the sampling signal supplied to the A/D converter 108 is adjusted by the A/D converter clock circuit 126 (described below) so that it is synchronized to the sample clock in the transmitter, in a manner described below.

Alternatively, the A/D converter could be driven by an asynchronous sampling signal (free running oscillator) and be followed by a digital interpolator (interpolation filter).

The digital signal from the A/D converter 108 is demodulated in the quadrature demodulator 109 to produce respective signals representing the real (in-phase) and imaginary (quadrature) components of a complex digital near baseband signal. An output terminal of the quadrature demodulator 109 produces a sequence of multibit digital signals representing the complex passband (near baseband) digital signal, and is coupled to an input terminal of a matched filter/ complement 110. This complex digital signal is then filtered in the matched filter/complement 110 which has a characteristic matched to the transmitted pulse shape.

A first output terminal of the matched filter/complement 110 is coupled to an A/D converter sample clock circuit 126. As shall be described further below, this clock circuit (a timing recovery circuit) produces accurate timing signals from various digital modulation signals. An output terminal of the A/D converter sample clock circuit 126 is coupled to a sample clock input terminal of the A/D converter 108. A second output terminal of the matched filter/complement 110 is coupled to a signal input terminal of the carrier tracking circuit 53. This circuit operates to synchronize the receiver to the carrier in VSB signals. For QAM signals, circuit 53 is bypassed. The output of circuit 53 is coupled to the signal processor 54. The signal processor equalizes and quantizes the passband signal to produce, on output path 15, a sequence of quantized symbols. The output path 15 carries the quantized symbols to utilization circuitry 56. The utilization circuitry may, for example, be circuitry for converting the symbols into digital data. The data is, in turn, coupled to a display device for displaying the image represented by the video signal, a storage system, such as a video cassette recorder, or disk drive.

Figure 2:
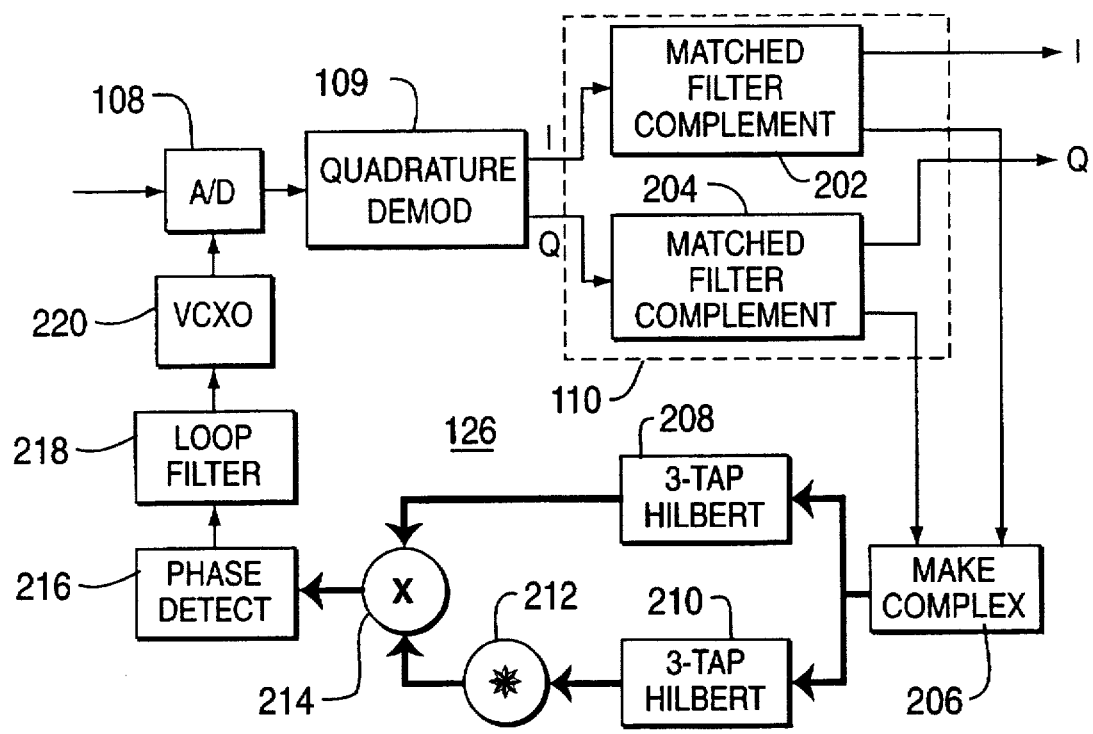
FIG. 2 is a detailed block diagram of the digital television signal receiver illustrated in FIG. 1 for synchronizing the receiver sampling clock to the transmitting clock.

FIG. 2 is a detailed block diagram of the demodulator 52 illustrated in FIG. 1 for synchronizing the receiver sampling clock to the transmitting clock for digitally modulated signals. In FIG. 2, the analog signal from the LPF 106 (of FIG. 1) is converted to a sequence of successive multibit digital signals by the A/D converter 108. The quadrature demodulator 109 demodulates the digital signal represented by the digital signal sequence into in-phase I (real) and quadrature Q (imaginary) component signals, illustrated separately in FIG. 2, in a known manner.

The I component signal is coupled to an input terminal of a first root raised cosine filter and complement 202, and the Q component signal is coupled to an input terminal of a second root raised cosine filter and complement 204. The first and second matched filter/complements, 202 and 204, respectively, in combination, form the matched filter/ complement 110. A first output terminal of the first matched filter/complement 202 is coupled to an I output terminal of the matched filter 110, and a second output terminal of the first matched filter complement 202 is coupled to a first input terminal of a known complex signal generating circuit 206. A first output terminal of the second matched filter complement 204 is coupled to a Q output terminal of the matched filter 110, and a second output terminal of the second matched filter complement 204 is coupled to a second input terminal of the complex signal generating circuit 206. An output terminal of the complex signal generating circuit 206 is coupled to respective input terminals of first and second 3-tap Hilbert filters, 208 and 210, which extract the positive and negative band edge component signals, respectively. The Hilbert filter structure is disclosed in detail below with respect to FIG. 5. An output terminal of the first Hilbert filter 208 is coupled to a first input terminal of a complex multiplier 214. An output terminal of the second Hilbert filter 210 is coupled to a second input terminal of the complex multiplier 214 through a complex conjugating circuit 212, which calculates the complex conjugate of the signal at its input terminal. An output terminal of the complex multiplier 214 is coupled to an input terminal of a phase detector 216. An output terminal of the phase detector 216 is coupled to the sample clock input terminal of the A/D converter 108 through the series connection of a loop filter 218, and voltage controlled crystal oscillator (VCXO) 220.

In operation, the first and second matched filter/complements, 202 and 204, respectively, produce at their respective first output terminals a low pass filtered output signal matched to the transmitted pulse shape. These output signals are supplied to the carrier tracking circuit 53 (of FIG. 1). The first and second matched filter/complements, 202 and 204, respectively, also produce at their respective second output terminals a complementary high pass filtered output signal which is used for band edge timing recovery and is supplied to the complex signal generating circuit 206. The combination of the complex signal generating circuit 206, the first and second Hilbert filters 208 and 210, the complex conjugate circuit 212 and the complex multiplier 214 generates a signal representing the timing error of the sampling signal supplied to the A/D converter 108.

The illustrated embodiment, using a single circuit, is arranged for processing OQAM, QAM, or VSB signals. The high pass filtered signal from the matched filter complements, 202 and 204, respectively, contains positive and negative high frequency components marking the band edges of the digital modulation signal. To generate the timing signal, the first and second Hilbert filters, 208 and 210, respectively, extract the positive and negative high frequency components. The complex product of one high frequency component with the complex conjugate of the other high frequency component is produced by the combination of the complex multiplier 214 and the conjugate circuit 212. The phase detector 216 detects one complex component, for example, the imaginary component of this signal. The combination of the phase detector 216, the loop filter 218 and the VCXO 220 operate to drive this complex component to zero, and thus eliminate any timing offset.

The illustrated embodiment will produce correct timing for signals containing VSB modulated data. However, for signals containing QAM modulated data, the illustrated embodiment produces a sampling clock at twice the QAM symbol rate. This means that a symbol occurs every other clock pulse. Specifically, one clock pulse occurs at a symbol time; a next clock pulse occurs at the crossover time between symbols; a next clock pulse occurs at the succeeding symbol time and so forth. This results in a phase ambiguity in the sampling clock signal when receiving QAM data signals. To eliminate this ambiguity, the timing recovery circuitry is modified to accommodate both QAM and VSB type modulations as described below with respect to FIG. 3. However, more traditional techniques of phase ambiguity resolution derived from the quantized symbols are also applicable. One skilled in the art of communications receiver design will understand how to use information derived from the equalizer and quantizer with the signal processor to traditionally resolve this ambiguity and determine which clock pulses occur at symbol times, and which occur at crossover times.

In prior art arrangements, two separate filters were required: one matched filter for the adaptive equalizer, and a separate filter to provide the high frequency band edge components for the timing recovery circuitry. In the present application, a single filter provides both the low frequency matched filtered signal, and the complementary high pass filtered signal. This simplifies the circuitry of the sample timing circuitry, and decreases the cost of implementing this circuitry. In addition, this matched filter/complement is a real only filter, with one filter section processing the real component and a second filter section processing the imaginary component. A detailed description of the matched filter/compliment 110 appears below with respect to FIG. 4.

In addition, prior art arrangements required two complex filters to derive the positive and negative high frequency band edge components, the implementation of each of which required two filters, one for the real component and one for the imaginary component. Thus, prior art arrangements required four filters instead of two, according to the present invention. In addition, in the present application, two relatively simple Hilbert filters, which do not require any multipliers, derive the positive and negative high frequency components.

Figure 3:
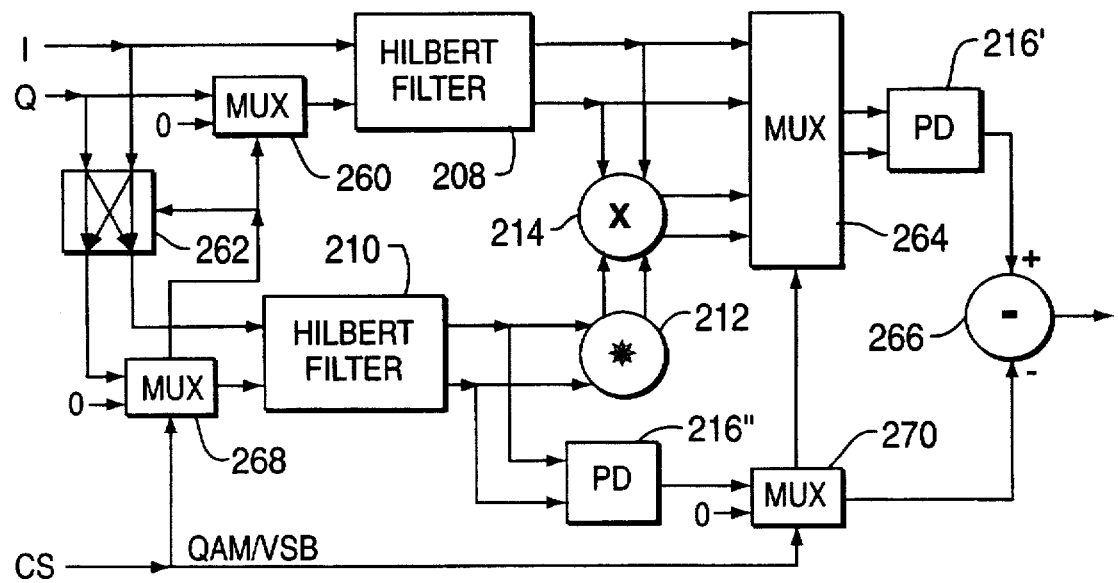
FIG. 3 is a detailed block diagram of an alternative embodiment of the television receiver illustrated in FIG. 1 for synchronizing the receiver sampling clock to the transmitting clock.

FIG. 3 is a detailed block diagram of an alternate embodiment of the portion of the receiver illustrated in FIG. 2 for synchronizing the receiver sampling clock to the transmitting clock. The alternative embodiment illustrated in FIG. 3 can synchronize the sampling clock for signals containing QAM, OQAM or VSB modulation formats. However, this embodiment has been modified so that the phase ambiguity for signals containing QAM modulated data, described above, has been eliminated. Elements in FIG. 3 which are similar to those illustrated in FIG. 2 are designated by the same reference number, and are not described in detail below.

In FIG. 3, a pair of input terminals I and Q receive real and imaginary component signals of a complex signal from respective matched filter/complements 202 and 204 (of FIG. 2). The real component signal input terminal I is coupled to a real input terminal of the first Hilbert filter 208, and to a real input terminal of a known controllable I/Q swapper circuit 262. The imaginary component signal Q is coupled to a first data input terminal of a first multiplexer 260, and to an imaginary input terminal of the controllable I/Q swapper circuit 262. A zero valued signal is coupled to the second data input terminal of the first multiplexer, and an output terminal of the first multiplexer 260 is coupled to an imaginary input terminal of the first Hilbert filter 208.

Respective real and imaginary output terminals of the first Hilbert filter 208 are coupled to a corresponding pair of data input terminals of a complex multiplexer 264 and a complex multiplier 214. A pair of real and imaginary output terminals of the complex multiplier 214 is coupled to a second pair of data input terminals of the complex multiplexer 264. A pair of output terminals of the complex multiplexer 264 is coupled to a corresponding pair of input terminals of a first phase detector (PD) 216', and an output terminal of the PD 216' is coupled to a non-inverting input terminal of a subtractor 266. An output terminal of the subtractor 266 is coupled to the input terminal of the loop filter 218 (of FIG. 2).

A real output terminal of the controllable I/Q swapper circuit 262 is coupled to a real input terminal of the second Hilbert filter 210. An imaginary output terminal of the controllable I/Q swapper circuit 262 is coupled to a first data input terminal of a second multiplexer 268. A zero valued signal is coupled to a second data input terminal of the second multiplexer 268, and an output terminal of the second multiplexer 268 is coupled to an imaginary input terminal of the second Hilbert filter 210. Respective real and imaginary output terminals of the second Hilbert filter 210 are coupled to respective input terminals of the complex conjugation circuit 212, and to a second phase detector PD 216". A pair of real and imaginary output terminals of the complex conjugation circuit 212 are coupled to a corresponding second pair of input terminals of the complex multiplier 214.

An output terminal of the second PD 216" is coupled to a first data input terminal of a third multiplexer 270, and a zero valued signal is coupled to a second data input terminal of the third multiplexer 270. An output terminal of the third multiplexer 270 is coupled to an inverting input terminal of the subtractor 266. A control signal input terminal CS is coupled to respective control input terminals of the first, second and third multiplexers, 260, 268 and 270, to a control input terminal of the complex multiplier 264, and to a control input terminal of the controllable I/Q swapper circuit 262.

In operation, the control signal from the control signal input terminal CS has a first state when the timing recovery circuit in FIG. 3 is to be set to receive a VSB or OQAM signal, and has a second state when it is to be set to receive a QAM modulated signal.

When a VSB/OQAM signal is being received, the control signal conditions the multiplexers and the controllable I/Q swapper circuit 262 to arrange the circuit illustrated in FIG. 3 to the arrangement illustrated in FIG. 2. Specifically, the controllable I/Q swapper circuit is conditioned to pass the signals at its input terminals to its output terminals unchanged. The first multiplexer 260 is conditioned to pass the signal from the Q input terminal to the first Hilbert filter 208, and the second multiplexer 268 is conditioned to pass the signal from the controllable I/Q swapper circuit 262 to the second Hilbert filter 210. The complex multiplexer 264 is conditioned to couple the signal from the complex multiplier 214 to the first phase detector 216' and the third multiplexer 270 is conditioned to pass the zero-valued signal to the subtractor 266. The resulting arrangement is the same as that illustrated in FIG. 2.

However, when a QAM signal is to be received, the control signal CS is placed in the second state. In this case, the controllable I/Q swapper circuit 262 is conditioned to produce an output signal in which the real and imaginary components of the input signal are swapped. That is, the signal at the real output terminal of the controllable I/Q swapper 262 is the signal from its imaginary input terminal, and the signal at the imaginary output terminal is the signal from its real input terminal. The first and second multiplexers, 260 and 268, respectively, are conditioned to pass the zero valued signal to the imaginary input terminals of their corresponding Hilbert filters, 208 and 210, respectively. The complex multiplexer 264 is conditioned to couple the output of the first Hilbert filter 208 to the first phase detector 216', and the third multiplexer 270 is conditioned to couple the output of the second phase detector 216" to the subtractor 266. In this configuration, the combination of the first and second phase detectors, 216' and 216", and the subtractor 266, operate as the phase detector 216 illustrated in FIG. 2.

In either arrangement, the Hilbert filters 208 and 210 extract the positive and negative high frequency band edge components of the television signal, and the phase detectors 216' and 216" produce a correction signal to control the timing of the A/D converter 108 (of FIG. 2), as described above.

Figure 4:
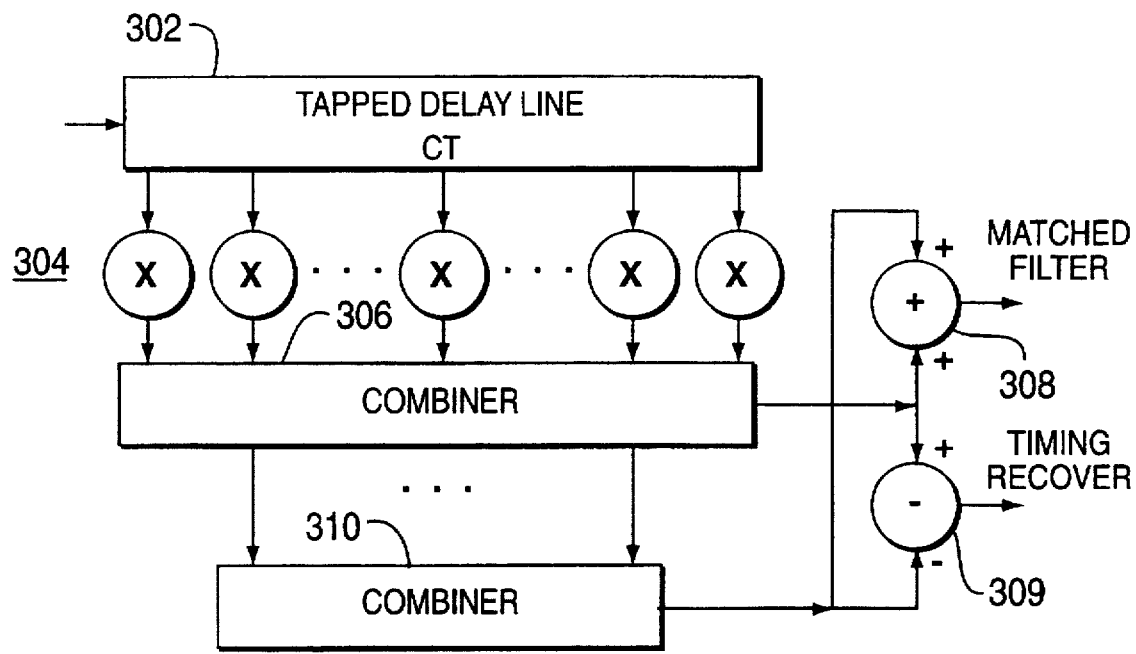
FIG. 4 is a detailed block diagram of a filter arrangement for use in the digital television signal receiver illustrated in FIG. 1 and FIG. 2.

FIG. 4 is a more detailed block diagram of a matched filter/complement for use in the digital modulation receiver illustrated in FIG. 1 and in FIG. 2 or FIG. 3. FIG. 4 illustrates the arrangement of the matched filter/complement 202 and/or 204. In FIG. 4, an input terminal of a tapped delay line 302 is coupled to the output terminal of the quadrature demodulator 109 (of FIG. 2). The tapped delay line 302 includes a plurality of output terminals, including even and odd taps and a center tap (CT), each producing copies of the signal at the input terminal delayed by respectively different time periods, in a known manner. Respective input terminals of a plurality of coefficient multipliers 304 are coupled to corresponding output terminals of the tapped delay line 302. Respective output terminals of the coefficient multipliers 304 coupled to the odd taps of the tapped delay line 302, including the center tap CT, are coupled to corresponding input terminals of a first signal combiner 306. Respective output terminals of the coefficient multipliers coupled to the even taps of the tapped delay line 302 are coupled to corresponding input terminals of a second signal combiner 310. An output terminal of the first signal combiner 306 is coupled to a first input terminal of an adder 308 and a non-inverting input terminal of a subtractor 309. An output terminal of the second signal combiner 310 is coupled to a second input terminal of the adder 308 and an inverting input terminal of the subtractor 309. An output terminal of the adder 308 provides the low pass filtered matched filter output signal and is coupled to the signal processor 54 (of FIG. 1). An output terminal of the subtractor 309 provides the complementary high pass filtered band edge signal, and is supplied to the make complex circuit 206 (of FIG. 2).

In operation, the filter arrangement of FIG. 4 provides complementary low pass and high pass filtered versions of the input signal. The low pass filtered version has a frequency characteristic matched to the transmitted pulse, e.g., a root raised cosine shape with two samples per symbol. The complementary high pass filtered version may be used to provide the band edge timing recovery. In this manner a single filter, plus a single additional subtractor, may be used to provide both functions. This lowers the fabrication cost of a television receiver constructed in this manner.

Figure 5:
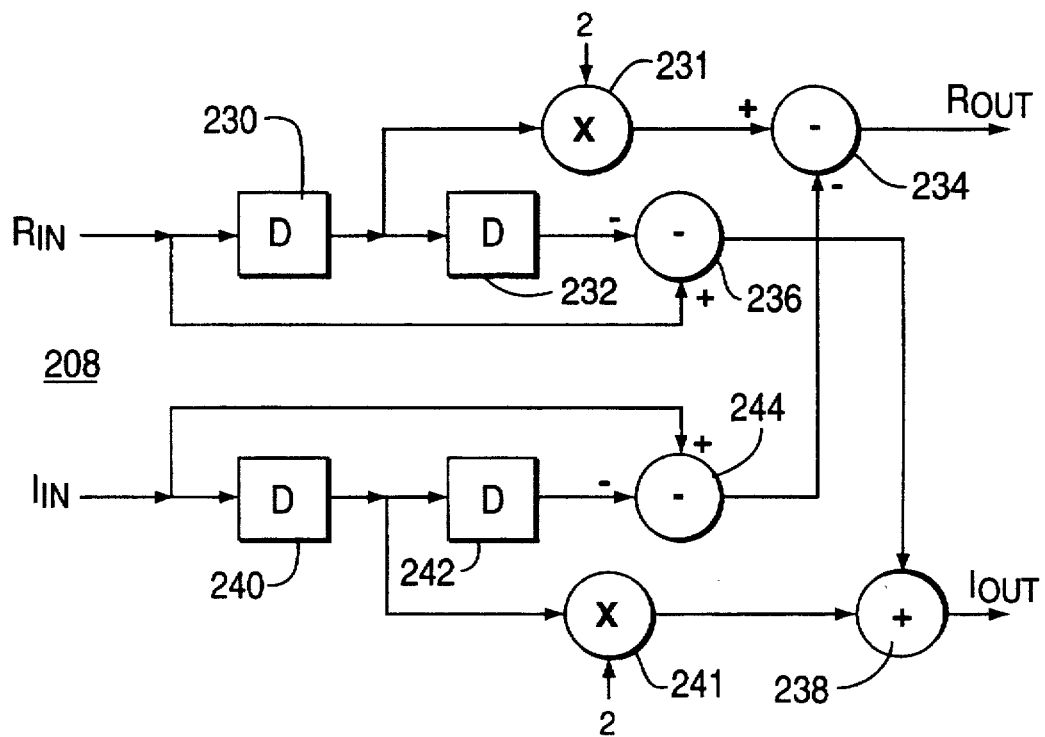
FIG. 5 is a detailed block diagram of a Hilbert filter used in the receiver illustrated in FIG. 3.

FIG. 5 is a more detailed block diagram illustrating the Hilbert filter 208 used in the receiver illustrated in FIGS. 2–3. In FIG. 5, a real input terminal $R_{in}$ and an imaginary input terminal $I_{in}$ are coupled to corresponding output terminals of the first and second matched filter complements 202 and 204, respectively (of FIG. 2). The $R_{in}$ input terminal is coupled to an input terminal of a first delay circuit 230 and to a non-inverting input terminal of a first subtractor 236. An output terminal of the first delay circuit 230 is coupled to an input terminal of a second delay circuit 232 and a multiplier 231 that multiplies the signal by two. The output of the multiplier is coupled to a non-inverting input terminal. The output of the multiplier is coupled of a second subtractor 234. An output terminal of the second delay circuit 232 is coupled to an inverting input terminal of the first subtractor 236.

The $I_{in}$ input terminal is coupled to an input terminal of a third delay circuit 240 and to a non-inverting input terminal of a third subtractor 244. An output terminal of the third delay circuit 240 is coupled to an input terminal of a fourth delay circuit 242 and a multiplier 241 that multiplies the signal by two. The output of the multiplier is coupled to a first input terminal of an adder 238. An output terminal of the fourth delay circuit 242 is coupled to an inverting input terminal of the third subtractor 244. An output terminal of the first subtractor 236 is coupled to a second input terminal of the adder 238, and an output terminal of the third subtractor 244 is coupled to an inverting input terminal of the second subtractor 234. An output terminal of the second subtractor 234 produces the real output signal $R_{out}$ and an output terminal of the adder 238 produces the imaginary output signal $I_{out}$. The respective real and imaginary output terminals, $R_{out}$ and $I_{out}$ are coupled to corresponding input terminals of the make complex circuit 206 of FIG. 2.

The Hilbert filter illustrated in FIG. 5 operates in a known manner to extract a positive high frequency component of the band edge signal from the matched filter/complement filters 110, as described above. This Hilbert filter, however, does not require multipliers; but instead requires only delay circuits, adders and subtractors, all of which are relatively inexpensive, compared to multiplier circuits. A Hilbert filter 210, for extracting a negative high frequency component, is constructed in a similar manner as that illustrated in FIG. 5 by reversing the signs on the input terminals of the subtractors 236 and 244.

Figure 6:
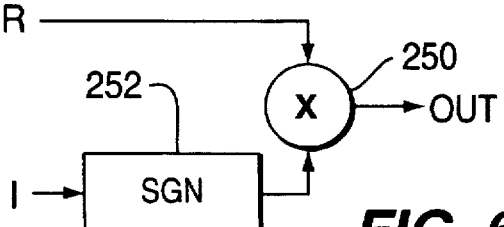
FIG. 6 is a detailed block diagram of a phase detector used in the receiver illustrated in FIG. 3.
Figure 13:
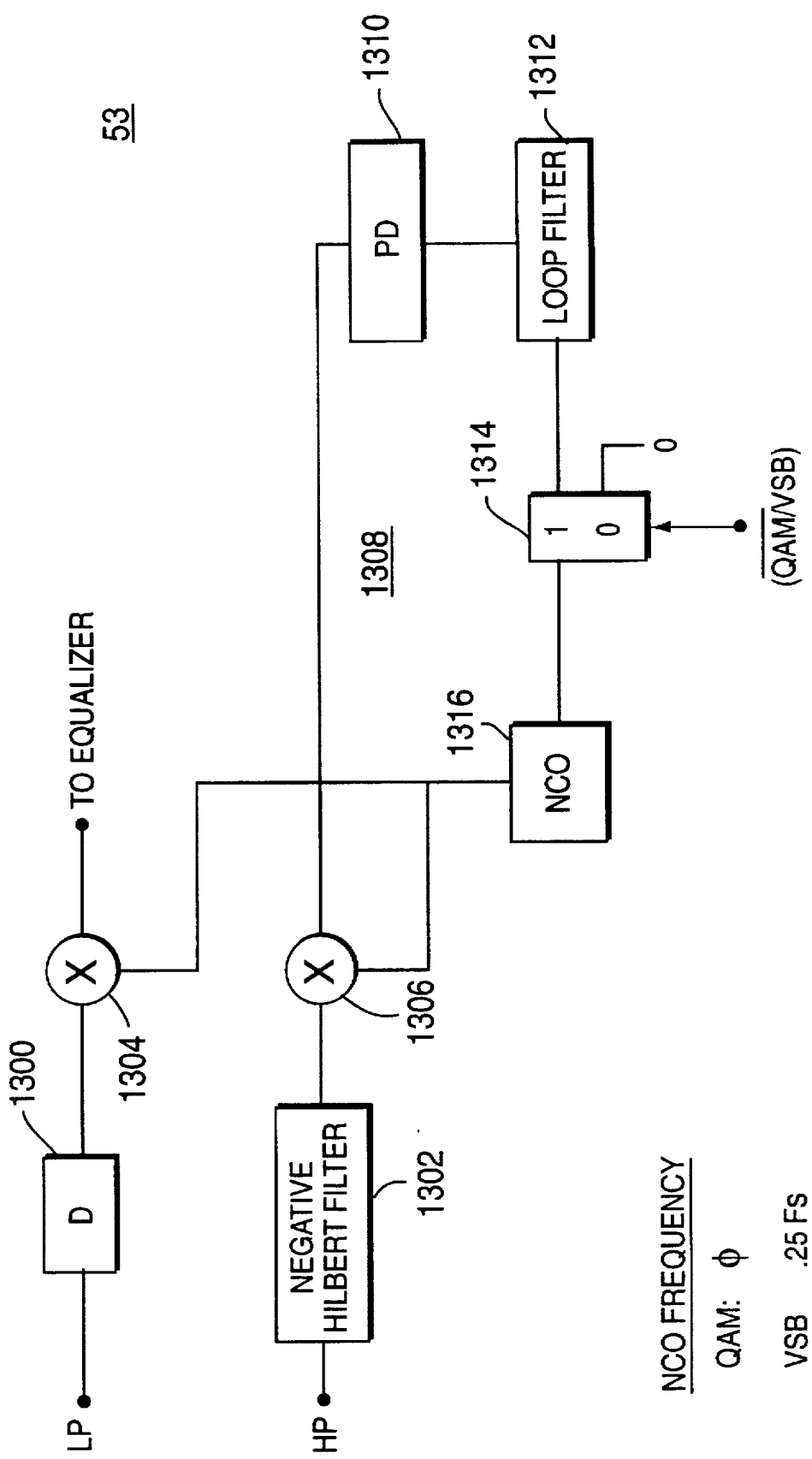
FIG. 13 depicts a detailed block diagram of the carrier tracking circuit of FIG. 1.

FIG. 6 is a more detailed block diagram of a phase detector used in the portion of the receiver illustrated in FIG. 3. In FIG. 6, a real signal input terminal R is coupled to a first input terminal of a multiplier 250. An imaginary signal input terminal I is coupled to an input terminal of a known SGN circuit. An output terminal of the SGN circuit is coupled to a second input terminal of the multiplier 250. An output terminal of the multiplier 250 produces the output signal OUT of the phase detector. The phase detector illustrated in FIG. 6 produces a signal representing the phase of the complex signal at its input terminals. FIG. 13 depicts a block diagram of the carrier tracking loop 53 of FIG. 1. This loop is used during VSB and OQAM reception only. For QAM the loop is passed, e.g., set multiplexer 1314 to output zero. This tracking loop 53 contains a one symbol period delay 1300, a pair of multipliers 1304 and 1306, a negative Hilbert filter 1302, and a carrier tracking loop 1308. The circuitry is coupled to the complimentary low pass and high pass outputs of the matched band edge filter 110 of FIG. 1. The low pass input is coupled to the delay 1300. The output of the delay is coupled to one input of the multiplier 1304. The delay time is equivalent to the time required for the signal to pass through the Hilbert filter 1302 which can be one or more symbol periods. The high pass filtered output is coupled to the negative Hilbert filter 1302. The Hilbert filter is centered upon the pilot tone for a VSB signal. The output of the Hilbert filter is coupled to one input of the second multiplier 1306. The output of the first multiplier 1304 is the output of the carrier tracking loop 1308 which is coupled to the signal processor (of FIG. 1). The carrier loop 1308 is used to generate a timing signal for multiplier 1304 such that the low pass filtered signal can be offset in frequency using a phase-locked signal such that a single equalizer can be used for filtering QAM, VSB, and OQAM signals. To facilitate phase locking the offset signal, the carrier loop 1308 contains a phase detector 1310 that is coupled to the output of the multiplier 1306, a loop filter 1312, a multiplexer 1314, and a numerically controlled oscillator 1316. The phase detector detects the phase error in the timing signal that is generated by the multiplier 1306 that multiplies the complex signal output of the NCO 1316 with the output of the negative Hilbert filter 1302. The loop filter 1312 extracts the low frequency components from the phase detector's output signal. The multiplexer 1314 enables and disables carrier loop 1308. For example, for QAM there needs to be no offset of the low pass filtered input; therefore, the carrier loop is disabled and multiplier 1304 passes the QAM signal to the equalizer unchanged. However, in the VSB and OQAM receiving modes the timing loop 1308 is enabled to offset the low pass signal. As such, when QAM is being received multiplexer 1314 has its output terminal coupled to the zero valued input terminal. For all other signals, the output of the loop filter is coupled through the multiplexer 1314 to the NCO 1316 to form a control voltage for the numerically controlled oscillator 1316. The output of the oscillator is coupled to both multipliers 1304 and 1306. Nominally, for VSB signals, the output of the oscillator is set at 0.25 times the symbol frequency and, for analog signals, it is set for 0.125 times the symbol frequency. In this manner, the high pass filter and the negative Hilbert filter extract the pilot tone from the VSB signal such that the timing loop 1308 is locked to the e pilot tone.

Figure 7:
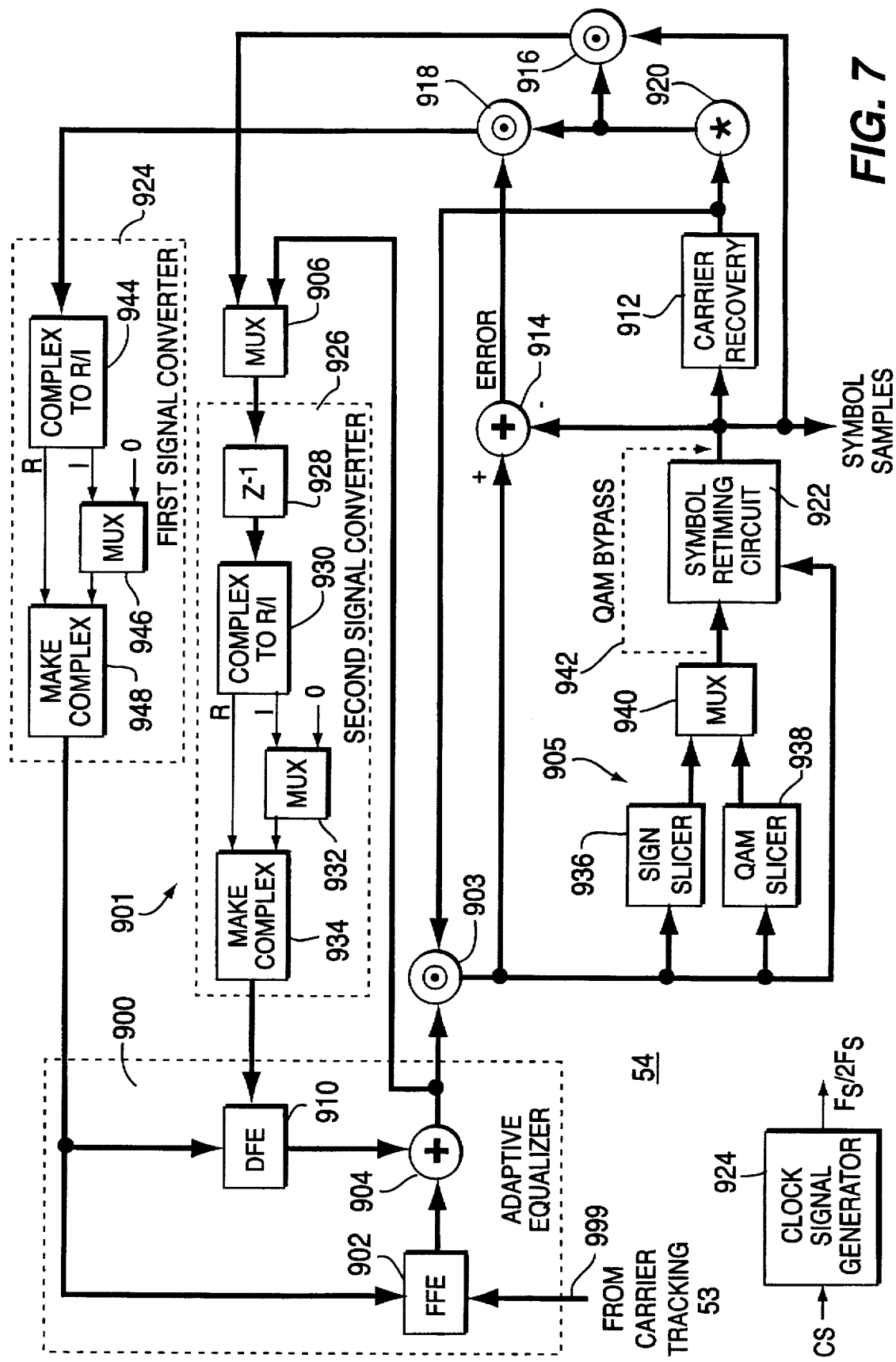
FIG. 7 is a detailed block diagram of adaptive equalizer and associated controller.

FIG. 7 is a detailed block diagram of the signal processor 54 illustrated in FIG. 1. The signal processor contains an adaptive equalizer 900, a controller 901, a derotator 903, and a quantizer 905. The controller 901 sets the coefficients in the adaptive equalizer 900 upon initial signal acquisition, and adjusts the coefficients in response to changes in the channel during reception of the signal. The equalizer of the present invention is a "blind" equalizer, in that, it does not utilize a "training sequence" to initialize the filter coefficients. As such, the coefficients are adjusted in view of the equalizer's output signal. Although other algorithms are available for accomplishing blind equalization, the present invention when receiving QAM signals, uses the well-known constant-modulus algorithm (CMA), also known as the Godard Algorithm. When receiving VSB signals, the invention uses the well-known Sato blind equalization algorithm.

The adaptive equalizer 900 contains a feed forward equalizer (FFE) 902, and a selective decision feedback equalizer (DFE) 910. Additionally, the controller 901 contains a multiplexer 906, first and second signal converters 924 and 926, a complex conjugate circuit 920, a first rerotator 916, a second rerotator 918, an error generator 914 and a carrier recovery circuit 912. These elements are interconnected as follows. An input terminal 999 is coupled to the output terminal of the carrier tracking circuit 53 (of FIG. 1). Input terminal 905 is coupled to an input terminal of the feed forward equalizer (FFE) 902. An output terminal of the FFE 902 is coupled to a first input terminal of a signal combiner 904. An output terminal of the signal combiner 904 is coupled to a first data input terminal of a multiplexer 906 of the controller 901 and the derotator 903. An output terminal of the multiplexer 906 is coupled to a data input terminal of the second signal converter 926. The second signal converter contains a one symbol delay 928, a "complex to real/imaginary" signal converter 930, a multiplexer 932, and a "make complex" circuit 934. The delayed complex signal is coupled to the complex signal converter 930 to extract real and imaginary signals from the complex signal. The real signal is coupled directly to the real input of the make complex circuit 934. The imaginary signal is coupled to a first input of multiplexer 932. The second input is coupled to zero. During QAM reception, the imaginary signal is selected and coupled to the multiplexer output terminal. However, during VSB/OQAM reception, the multiplexer supplies no signal to the imaginary terminal of the make complex circuit 934. The make complex circuit 934 converts the real and imaginary signals into a complex signal for use by the DFE 910. An output terminal of the DFE 910 is coupled to a second input terminal of the signal combiner 904.

An output terminal of the derotator 903 is coupled to an input terminal of the quantizer 905. The quantizer contains a sign slicer 936, QAM slicer 938 and a multiplexer 940.

The multiplexer selects as an output of the quantizer either the sign value or the symbol value. In VSB/OQAM mode, the quantizer begins with only the sign value until the Sato algorithm has achieved equalization, then the quantizer is switched to the QAM slicer to provide symbol samples. In the QAM mode, the quantizer is always set to perform QAM slicing. The QAM slicer is selected to quantize the maximum expected constellation size, e.g., a 256-QAM slicer. The output of the multiplexer is coupled to the symbol retiming circuit 922.

The symbol retiming circuit 922 is used during VSB/OQAM mode only. During QAM mode, the circuit is bypassed as indicated by dashed arrow 942. The symbol retiming circuit is described in detail with respect to FIG. 12 below. The output terminal of circuit 922 is coupled to a first input of a carrier recovery circuit 912, to a first input terminal of the error generator 914 and to an input terminal of the rerotator 916. An output terminal of the quantizer 905 is coupled to a second input terminal of the carrier recovery circuit 912, to a second input terminal of the error generator 914, and to a data input terminal of a first rerotator 916. An output terminal of the first rerotator 916 is coupled to a second data input terminal of the multiplexer 906. An output terminal of the error generator 914 produces an error signal e and is coupled to a data input terminal of a second rerotator 918. An output terminal of the second rerotator 918 is coupled to the first signal converter 924. The first signal converter contains a complex to real/imaginary converter 944, a multiplexer 946, and a make complex circuit 948. As with the second signal converter 926, this converter converts the complex input signal into real and imaginary signals, couples the real signal to the make complex circuit 948, selectively couples the imaginary signal to the make complex circuit 948, and produces a complex signal. The multiplexer selects the imaginary component during QAM mode and no signal during VSB/OQAM mode. The complex output from converter 924 is coupled to respective control input terminals of DFE 910 and FFE 902.

An output terminal of the carrier recovery circuit 912 is coupled to a control input terminal of the derotator 903, and to an input terminal of a complex conjugate circuit 920. An output terminal of the complex conjugate circuit 920 is coupled to respective control input terminals of the first and second rerotators 916 and 918.

In operation, the adaptive equalizer 900, including the FFE 902, the DFE 910 and the signal combiner 904, operate on an input signal on path 999 in the passband, before the carrier signal has been recovered. The remainder of the circuit, including the quantizer 907, the error generator 914, and the carrier recovery circuit 912, operate at baseband. The derotator 903 performs the translation from the passband to the baseband under the control of the carrier recovery circuit 912.

For QAM, the adaptive equalizer 900 uses the known constant modulus algorithm (CMA) technique for adapting its coefficients to a newly received signal. For VSB, the equalizer uses the Sato blind equalization algorithm to equalize the sign bit before switching to the CMA algorithm to equalize the symbol data. The algorithms use an equalization criterion that depends on the amount of intersymbol interference at the output of the equalizer, but is independent of the symbol constellation size and carrier phase. In order to simultaneously adapt the coefficients of both the FFE 902 and the DFE 910 during initial signal acquisition, the multiplexer 906 is conditioned to couple the output of the signal combiner 904 to the input terminal of the DFE 910 during the signal acquisition period. Thus, during the signal acquisition period, the FFE 902 and DFE 910 operate as a finite impulse response filter (FIR) and an infinite impulse response (IIR) filter, respectively.

This arrangement provides two advantages. First, the DFE 910, operated as an IIR, provides better ISI cancellation during the signal acquisition period than the FFE 902 alone provides. Thus, the decisions made by the quantizer 905 after the coefficients in the adaptive equalizer have converged (in a manner to be described in more detail below) are likely to be more accurate than those in the prior art arrangement, and subsequent data recovery will, therefore, more likely proceed properly. Second, there is no migration of coefficients from the FFE 902 to the DFE 910 after the signal acquisition period. This results in a simpler circuit structure with simpler controlling circuitry that is available in the prior art.

The equalized signal from the adaptive equalizer 900 is a passband signal. During normal operations, this signal is translated into the baseband by the operation of the derotator 903 under the control of the carrier recovery circuit 912 (described in more detail below). The baseband signal from the derotator 903 is then processed by the symbol retiming circuit 922 and the quantizer 907 to generate estimated received symbols, which correspond to the transmitted symbols.

However, during the signal acquisition period, after the coefficients of the adaptive equalizer 900 have converged (as described above), the carrier signal must be acquired, in a manner to be described in more detail below. During this carrier recovery period, the FFE 902 and DFE 910 remain in the FIR/IIR arrangement. To achieve carrier recovery for the various digital modulation formats, a symbol retiming technique must be used, otherwise quantization may occur between symbol locations for some of the modulation formats that the receiver is intended to process. As such, the present invention includes a symbol retiming circuit 922 that corrects the symbols at baseband to ensure the baseband sequence is appropriate for quantization and carrier recovery no matter which digital modulation format is being received.

Specifically, FIG. 12 depicts a detailed block diagram of the symbol retiming circuit 922 of FIG. 7. The retiming circuit 922 contains a pair of complex to real/imaginary converters 1200 and 1202, a make complex circuit 1204, a pair of one symbol delays 1206 and 1208, and a pair of make complex circuits 1210 and 1212. The complex signal from the quantizer (940 of FIG. 7) is coupled to the converter 1200 to produce the real and imaginary components of the quantized signal. The real component is coupled to the real input terminals of make complex circuits 1210 and 1204. The real component is also coupled to delay 1208 (one symbol period). The output of the delay is coupled to the imaginary input of the make complex circuit 1210. The complex signal from circuit 1210 forms one input (A input) to the carrier recovery circuit (912 of FIG. 7).

A complex signal from rotator 903 is coupled to complex to real/imaginary converter 1202. The imaginary output of converter 1202 is connected to circuitry 1204. This circuit produces the symbol samples. The real output of converter 1202 is coupled to the real input of make complex circuit 1212 and an input to delay 1206. The output of delay 1206 forms the imaginary input of circuit 1212. The complex signal generated by circuit 1212 is coupled to input B of the carrier recovery circuit (912 of FIG. 7).

Figure 8:
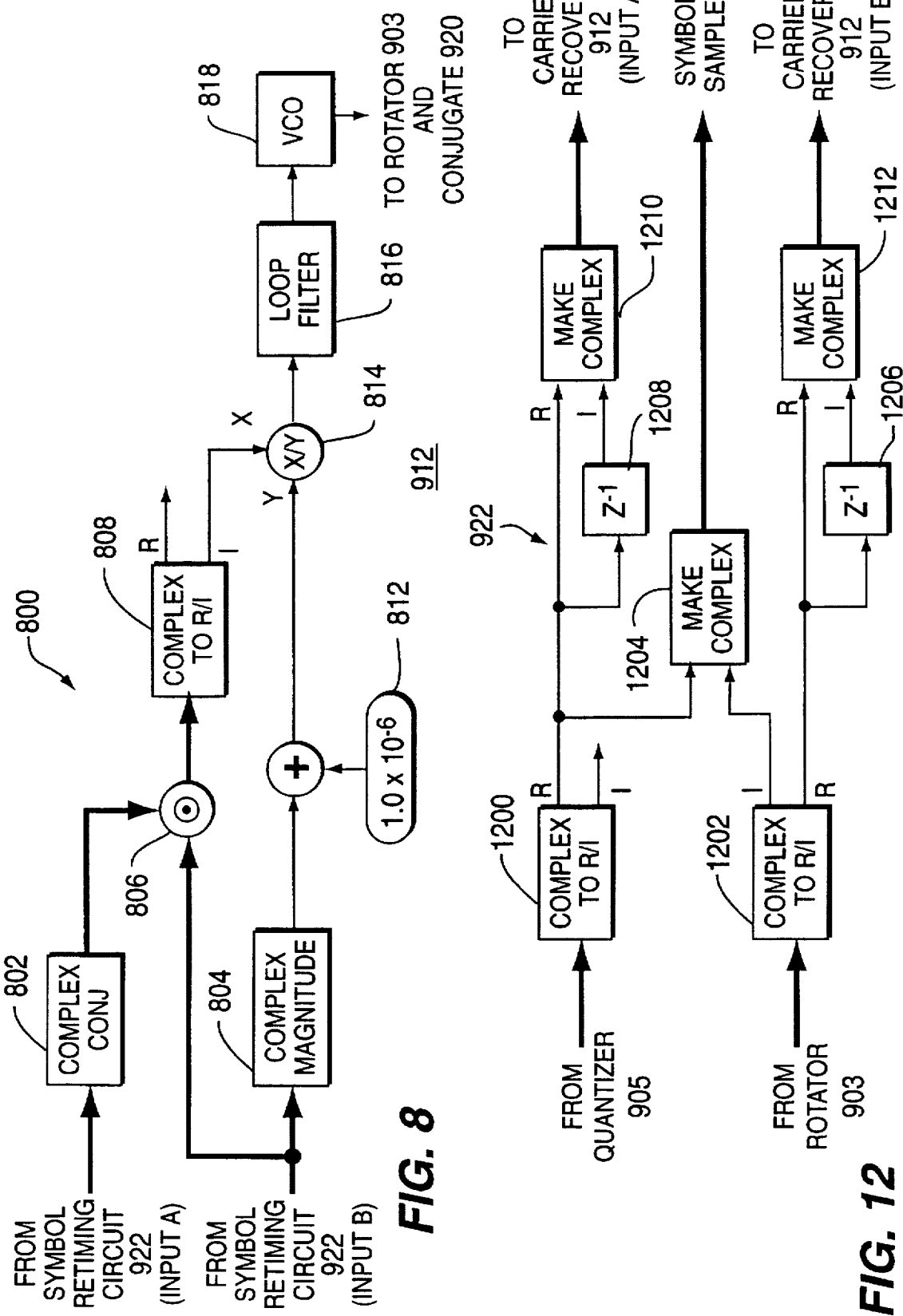
FIG. 8 is a detailed block diagram of a carrier recovery circuit.

FIG. 8 depicts a detailed block diagram of the carrier recovery circuit 912 illustrated in FIG. 7. The carrier recovery circuitry tracks the phase of the carrier signal based on the decisions made by the quantizer 905. This circuitry is clocked at one rate for receiving QAM signals (e.g., rate Fs) and at double the QAM clocking rate for receiving VSB and OQAM signals (e.g., rate $2F_s$). The carrier recovery circuit contains a phase detector 800, a loop filter 816 and a VCO 818. A first input terminal (Input A) is coupled from the symbol retiming circuit (922 in FIG. 12) to a complex conjugate circuit 802. The output of the circuit 802 is coupled to one input of rerotator 806. A second input terminal (Input B) is coupled from the symbol retiming circuit to a complex magnitude circuit 804 and a second input of rerotator 806. The output of the rerotator is coupled to the complex to real/imaginary converter 808. The real component is ignored and the imaginary component is coupled to the x terminal of and x/y divider 814. The output of the complex magnitude circuit 804 that produces the magnitude of the signal at input B is added to a constant (e.g., $1.0 \times 10^{-6}$) using adder 810. The output of the adder is the y input of the x/y divider 814. The foregoing circuitry is a phase detector that produces a phase error signal for both QAM and VSB/OQAM signals.

The output of the phase detector 800 is connected to a loop filter 816 that produces a low frequency (e.g., DC) signal for controlling the VCO 818. The output is a phase locked frequency that is used for derotating and rerotating the signals within the signal processor (54 of FIG. 1).

Returning to FIG. 7, during normal operations, the derotated received signal from the derotator 903 is processed by the QAM quantizer or slicer 905 to determine the constellation point on the complex plane to which this received signal is closest. The output of the slicer 938 is a complex signal having the value of that closest constellation point. However, when the receiver initially receives a new signal, the carrier frequency and phase have not yet been acquired. Thus, the decisions made by the slicer 938 will often be incorrect. Using the incorrect decision in an attempt to acquire the carrier phase will impair such acquisition, and may even prevent acquisition.

Figure 9:
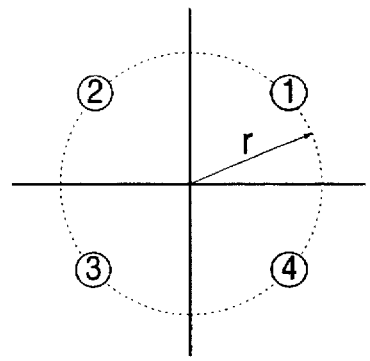
FIG. 9 and FIG. 10 are complex plane diagrams useful in understanding the operation of the digital television signal receiver illustrated in FIG. 11.

In order to initially acquire the carrier, the decisions made by the slicer 938 are first made in a coarse fashion. For example, referring to the complex plane illustrated in FIG. 9, when beginning operation to assume an artificial constellation consisting of four points: 1, 2, 3, and 4, each lying at a radius r from the origin and along a 45 degree, 135 degree, 225 degree and 315 degree angle, respectively. A quantizer operating according to this constellation will produce a signal corresponding to point 1 whenever the input complex signal at the input terminal is in the first quadrant. It will produce a signal corresponding to point 2 whenever the input complex signal is in the second quadrant, and so forth. In prior art arrangements, such a quantizer operates using this constellation until the decisions being made are sufficiently accurate. For example, if 90% of the decision were accurate, then the quantizer was switched from the quadrant mode to a full decision directed mode, in which decisions are made involving the full constellation.

Figure 10:
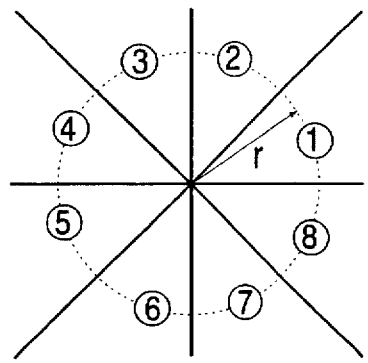

However, in some cases, the partial carrier acquisition achieved by operating the QAM slicer 938 in the quadrant mode is not sufficient to allow the quantizer to achieve lock when switched to the full decision directed mode. According to the present invention, after the slicer, operating in the quadrant mode, has achieved the desired degree of accuracy, the slicer begins operations in a finer mode, but not yet in the full decision directed mode. Referring to FIG. 10, the complex plane is divided into octant, and an artificial constellation is used in the quantizer consisting of eight points: 1, 2, 3, 4, 5, 6, 7 and 8, each lying at a radius r from the origin and along a 22.5 degree, 67.5 degree, 112.5 degree, 157.5 degree, 202.5 degree, 247.5 degree, 292.5 degree, and 337.5 degree angle, respectively. When the quantizer operates in this mode, any input signal lying the octant containing point 1 will condition the quantizer to produce a signal having the value of point 1; any input signal lying in the octant containing point 2 will condition the quantizer to produce a signal having the value of point 2, and so forth. When the quantizer operating in the octant mode has achieved the desired accuracy, the resulting error is much less than would have been produced by a quantizer operating in the quadrant mode. It is much more likely that carrier recover will be achieved when the quantizer is switched into the full decision directed mode from the octant mode, than from the quadrant mode.

Figure 11:
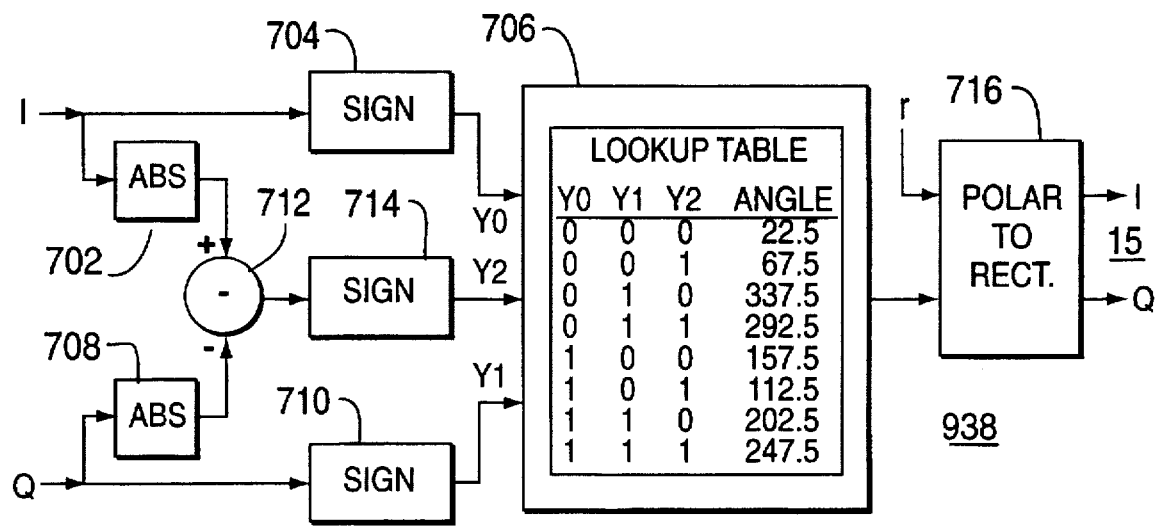
FIG. 11 is a detailed block diagram of a quantizer having an improved initialization technique.

FIG. 11 is a detailed block diagram of a portion (QAM slicer 938) of the quantizer 905 which performs quantization in the octant mode, as described above. In FIG. 11, separate I and Q input terminals are illustrated which are coupled to receive the I and Q components of the complex signal from the output terminal of the symbol retiming circuit 922 (of FIG. 7). The I input terminal is coupled to respective input terminals of a first absolute value circuit 702 and a first sign determining circuit 704. An output terminal of the first sign determining circuit 704 is coupled to a Y0 input terminal of an angle calculating circuit 706. The Q input terminal is coupled to respective input terminals of a second absolute value circuit 708 and a second sign determining circuit 710. An output terminal of the second sign determining circuit 710 is coupled to a Y1 input terminal of the angle calculating circuit 706. An output terminal of the first absolute value circuit 702 is coupled to a non-inverting input terminal of a subtractor 712, and an output terminal of the second absolute value circuit 708 is coupled to an inverting input terminal of the subtractor 712. An output terminal of the subtractor 712 is coupled to an input terminal of a third sign determining circuit 714. An output terminal of the third sign determining circuit 714 is coupled to a Y2 input terminal of the angle calculating circuit 706. An output terminal of the angle calculating circuit 706 is coupled to a first input terminal of a polar-to-rectangular converter 716. A second input terminal of the polar-to-rectangular converter 716 is coupled to a source of a signal having the value r. Respective I and Q output terminals of the polar-to-rectangular converter 716 are coupled to the output terminal 15, to the derotator control circuit 122, and to the adaptive equalizer control circuit 120 (of FIG. 1).

In operation, each sign determining circuit (704, 710 and 714) produce a logic '0' signal if the value of its input signal is positive and a logic '1' if it is negative. Referring again to FIG. 10, if the value of the output signal from the first sign determining circuit 704 is a logic '0', then the value of the input complex signal is in the right half of the illustrated complex plane, and if it is a logic '1', then it is in the left half. Similarly, if the value of the output signal from the second sign determining circuit 710 is a logic '0', then the value of the input complex signal is in the upper half of the illustrated complex plane, and if it is a logic '1', then it is in the lower half. If the value of the output signal from the third sign determining circuit 714 is a logic '0', then the value of the input complex signal is in an octant adjacent the horizontal I axis, i.e. octant 1, 4, 5, or 8, and if it is a logic '1', then it is in an octant adjacent the vertical Q axis, i.e. octant 2, 3, 6, or 7. The angle calculating circuit 706 processes the signals at the Y0, Y1 and Y2 input terminals, determines in which octant the input complex signal lies, and generates an angle which bisects that octant. For example, if Y0 is a logic '0', indicating that the complex signal lies in the right half of the complex plane; Y2 is a logic '0' indicating that the complex signal lies in the upper half of the complex plane; and Y1 is a logic '0' indicating that the complex signal lies in an octant adjacent the horizontal I axis: this is octant 1. The angle of the bisector of octant 1 is 22.5 degrees. The angle calculating circuit may comprise an eight entry lookup table arranged as illustrated in FIG. 10.

The polar-to-rectangular converter 716 takes the angle generated by the angle calculating circuit 706, and the radius input signal r and generates the rectangular complex coordinates (i.e. the in-phase (real) I, and quadrature (imaginary) Q components) corresponding to that angle and radius in a known manner. The fixed radius input r may be selected to be the mean radius of the QAM constellation, which may be predetermined in a known manner from the size and arrangement of the constellation points for the selected size QAM constellation. The I and Q components resulting from this conversion are supplied to the output of the quantizer 907 as the selected constellation point while the quantizer is operating in the octant mode. The polar to rectangular converter 716 may also comprise a lookup table. One skilled in the art will further understand that it is not necessary to have an input terminal for the signal r, if it remains constant, and will also understand that, in an actual implementation, the angle calculating circuit 706 and the polar to rectangular converter 716 may comprise a single eight entry look up table producing the rectangular I and Q coordinates directly corresponding to the Y0, Y1 and Y2 input signals.

Referring again to FIG. 7, the input signal to the quantizer 905, and the output signal from the quantizer 905, are supplied through the symbol retiming circuit 922 to the carrier recovery circuit 912. In each operating mode of the quantizer (described above), the carrier recovery circuit 912 generates a carrier signal that is supplied to the derotator 903 to change the phase and amplitude of the equalized signal representing the estimated received symbols to align them with the ideal constellation.

After the quantizer has passed from operating in the quadrant mode, to operating in the octant mode, and then to operating in the full decision directed mode, as described above, the multiplexer 906 is conditioned to couple decisions from the quantizer to the DFE 910, which, then begins operation as a decision feedback equalizer, rather than as an IIR. In this operating mode, the coefficients of the FFE 902 and DFE 910 track changing channel conditions. The error signal from error generator 914, represents the difference between the complex value of the signal at the quantizer input terminal, representing the received symbol, and the signal at the quantizer output terminal representing the estimated received symbol. The error signal is coupled to control input terminals of the FFE 902 and DFE 910. The FFE 902 and DFE 910, in response to the error signal, adjust their coefficients, in a known manner, in an effort to minimize the error signal.

However, from FIG. 7 it can be seen that the adaptive equalizer 900 is operating on a passband (not derotated) signal, while the quantizer 905 and carrier recovery circuit 912 are operating on a baseband (derotated) signal. In order to allow the adaptive equalizer 900 to properly adjust its coefficients while operating on a signal in the passband, the decisions from the quantizer 905, and the error signal from the error generator 914, both of which are baseband signals, are rerotated back into the passband by the operation of the first and second rerotators 916 and 918, respectively. The control signals for the first and second rerotators, 916 and 918, respectively, are derived from the control signal generated by the carrier recovery circuit 912 for the derotator 903. The control signal from the carrier recovery circuit 912 is conjugated by the complex conjugating circuit 920. The conjugated control signal is supplied to the rerotators 916 and 918, which, in response to this conjugated control signal, perform the inverse operation to the derotator 903, and rerotate the decisions from the quantizer 905 and the error signal from the error generator 914, respectively, back into the passband. Thus, the adaptive equalizer 900 can continue to operate in the passband, while the quantizer 905, carrier recovery circuit 912 and error generator 914 can continue to operate in the baseband.

It is generally difficult to switch an adaptive equalizer from operating in the passband during the signal acquisition period, to operating the baseband during the normal operating mode. But in prior arrangements, this was necessary because the decisions which were to be fed back to the DFE portion of the adaptive equalizer during the normal operating mode were in the baseband. The arrangement of the present application provides the advantage of allowing the adaptive equalizer coefficients to be initially converged in the passband, and then allowing it to continue to operate in the passband in a decision feedback mode after the QAM carrier has been acquired. It also isolates the operation of the adaptive equalizer from the operation of the carrier recovery circuit and the quantizer.

To have an effective adaptive equalizer that equally operates for QAM, OQAM and VSB, three signals in the signal processor 54 must be altered. First, in QAM mode, the symbol retiming circuit 922 is bypassed and, in VSB/OQAM mode, the symbols are retimed by circuit 922. Second, in QAM mode, the clock speed of the signal processor is equivalent to the symbol rate (Fs); however, in VSB/OQAM mode, the clock speed is doubled. As such, signal processor 54 contains a dual speed, switchable clock 924 that switches the clock speed in response to the CS signal.

Lastly, the signal converters 924 and 926 are switched such that in VSB/OQAM the adaptive equalizer is controlled by real signals, while in the QAM mode control is accomplished with complex signals.

Although various embodiments which incorporate the teachings of the present invention have been shown and described in detail therein, those skilled in the art can readily devise many other varied embodiments that still incorporate these teachings.

What is claimed is:

1. A signal processing apparatus for processing a passband signal to produce an equalized signal, said signal processing apparatus comprising:

a passband adaptive equalizer, containing a passband feed forward equalizer (FFE) and a passband decision feedback equalizer (DFE), for processing said passband signal to produce said equalized signal;

an equalizer control circuit, coupled to said passband adaptive equalizer, for initializing and updating parameters of said passband adaptive equalizer;

a derotator, coupled to said passband adaptive equalizer and said equalizer control circuit, for derotating the equalized signal to form a baseband signal; and a quantizer, coupled to said derotator and said equalizer control circuit, for quantizing said baseband signal to produce quantized symbols;

said feed forward equalizer being coupled to said equalizer control circuit and having an output terminal coupled to a signal combiner;

said decision feedback equalizer being coupled to said equalizer control circuit and having an output terminal connected to said signal combiner, where an output signal of said signal combiner is the equalized signal; and said equalizer control circuit causing said decision feedback equalizer to operate in one of a decision feedback mode and a infinite impulse response (IIR) mode.

2. The signal processing apparatus of claim 1 wherein the passband adaptive equalizer has coefficients that are adjusted using blind equalization in accordance with a constant modulus algorithm.

3. The signal processing apparatus of claim 1 wherein the equalizer control circuit comprises:

an error generator, coupled to the quantizer and the derotator for producing an error signal;

a rotator, coupled to said error generator, for rotating the error signal and coupling the rotated error signal to the passband adaptive equalizer.

4. The signal processing apparatus of claim 1 wherein the feed forward equalizer is a finite impulse response filter and the decision feedback equalizer is an infinite impulse response filter.

5. The signal processing apparatus of claim 1 wherein the passband signal is a quadrature amplitude modulated (QAM) signal, a vestigial sideband (VSB) modulated signal, or a offset QAM (OQAM) signal.

6. A receiver for receiving signals having digital modulation formats, said receiver comprising:

an analog-to-digital (A/D) converter for digitizing received signals;

a quadrature demodulator, coupled to said A/D converter, for producing a complex signal having a center frequency in response to the digitized received signals;

a matched filter, coupled to said quadrature demodulator, for filtering said complex signal;

a carrier tracking circuit, coupled to said matched filter, for locking an oscillator to a carrier signal within said complex signal whenever said complex signal contains said carrier signal, and for adjusting the center frequency of said complex signal whenever said complex signal contains said carrier signal;

a passband adaptive equalizer, coupled to said carrier tracking circuit and containing a passband feed forward equalizer (FFE) and a passband decision feedback equalizer (DFE), for equalizing passband signal of said complex signal to produce an equalized signal;

an equalizer control circuit, coupled to said passband adaptive equalizer, for initializing and updating parameters of said passband adaptive equalizer;

a derotator, coupled to said passband adaptive equalizer, for converting said equalized signal to a baseband signal; and a quantizer, coupled to said derotator and said equalizer control circuit, for quantizing the baseband signal to produce quantized symbols;

said passband adaptive equalizer further comprising a signal combiner, coupled to said passband decision feedback equalizer (DFE) and said passband feed forward equalizer (FFE), for combining output signals from the DFE and FFE to form said equalized signal; and said equalizer control circuit causing said decision feedback equalizer to operate in one of a decision feedback mode and a infinite impulse response (IIR) mode.

7. The receiver of claim 6 wherein said received signals include quadrature amplitude modulated (QAM) signals, vestigial sideband (VSB) modulated signals, or offset QAM (OQAM) signals.

8. The receiver of claim 6 wherein the passband adaptive equalizer has coefficients that are adjusted using blind equalization in accordance with a constant modulus algorithm.

9. The receiver of claim 6 further comprising:

an error generator, coupled to said derotator and said quantizer, for generating an error signal;

a rotator, coupled to said error generator, for rotating said error signal; and a signal converter, coupled to said rotator and said passband adaptive equalizer, for converting said rotated error signal into a control signal for said passband adaptive equalizer.

10. The receiver of claim 9 wherein said signal converter comprises:

a complex to real/imaginary converter for converting the rotated error signal into real and imaginary components;

a multiplexer, coupled to the complex to real/imaginary converter, for selecting the imaginary component when a QAM signal is received and no signal when a VSB or OQAM signal is received; and a make complex converter, coupled to the complex to real/imaginary converter and the multiplexer, for converting the real component and selected signal into the control signal for the passband adaptive equalizer.

11. The receiver of claim 6 further comprising:

a symbol retiming circuit, coupled to said quantizer and said derotator, for retiming said quantized symbols that are generated from received signals carrying either VSB or OQAM modulation, to produce symbol samples.

12. The receiver of claim 11 further comprising:

a carrier recovery circuit, coupled to said symbol retiming circuit and said derotator, for locking an oscillator to said quantized symbols or said symbol samples.

13. The receiver of claim 6 further comprising:

a rotator, coupled to said quantizer, for rotating said quantized symbols;

a multiplexer, coupled to said passband adaptive equalizer and said rotator, for selecting either the equalized signal or the rotated quantized symbols as a multiplexer output signal; and a signal converter, coupled to said multiplexer and said passband adaptive equalizer, for converting said multiplexer output signal into an input signal for said DFE.

14. The receiver of claim 13 wherein the signal converter comprises:

a delay for delaying said multiplexer output signal;

a complex to real/imaginary converter, coupled to said delay, for converting the delayed signal into real and imaginary components;

a multiplexer, coupled to the complex to real/imaginary converter, for selecting the imaginary component when a QAM signal is received and no signal when a VSB or OQAM signal is received; and a make complex converter, coupled to the complex to real/imaginary converter and the multiplexer, for converting the real component and selected signal into the input signal for the DFE.

15. A receiver for receiving signals having digital modulation formats such as quadrature amplitude modulated (QAM) signals, vestigial sideband (VSB) modulated signals, or offset QAM (OQAM) signals, said receiver comprising:

an analog-to-digital (A/D) converter for digitizing received signals;

a quadrature demodulator, coupled to said A/D converter, for producing a complex signal having a center frequency in response to the digitized received signals;

a matched filter, coupled to said quadrature demodulator, for filtering said complex signal;

a carrier tracking circuit, coupled to said matched filter, for locking an oscillator to a carrier signal within said complex signal whenever said complex signal contains said carrier signal and for adjusting the center frequency of said complex signal whenever said complex signal contains said carrier signal;

a passband adaptive equalizer, coupled to said carrier tracking circuit, for equalizing said complex signal, said passband adaptive equalizer comprising a feed forward equalizer (FFE), a decision feedback equalizer (DFE) and a signal combiner, coupled to said DFE and FFE, for combining output signals from the DFE and FFE to form an equalized signal;

a derotator, coupled to said passband adaptive equalizer, for converting said equalized signal to a baseband signal;

a quantizer, coupled to said derotator, for quantizing the baseband signal to produce quantized symbols;

a symbol retiming circuit, coupled to said quantizer and said derotator, for retiming said quantized symbols generated from received VSB or OQAM signals to produce symbol samples, said symbol retiming circuit being bypassed for received QAM signals;

a carrier recovery circuit, coupled to said symbol retiming circuit and said derotator, for locking an oscillator to said quantized symbols or said symbol samples;

an error generator, coupled to said derotator and said symbol retiming circuit, for generating an error signal in response to said symbol samples or said quantized symbols and said baseband signal;

a first rotator, coupled to said error generator, for rotating said error signal;

a first signal converter, coupled to said first rotator and said passband adaptive equalizer, for converting said rotated error signal into a control signal for said passband adaptive equalizer;

a second rotator, coupled to said symbol retiming circuit, for rotating said symbol samples or said quantized symbols;

a multiplexer, coupled to said passband adaptive equalizer and said second rotator, for selecting either the equalized signal or the rotated symbol samples or the quantized symbols as a multiplexer output signal; and a second signal converter, coupled to said multiplexer and said passband adaptive equalizer, for converting said multiplexer output signal into an input signal for said DFE.

16. The receiver of claim 15 wherein the passband adaptive equalizer has coefficients that are adjusted using blind equalization in accordance with a constant modulus algorithm.

17. The receiver of claim 16 wherein said first signal converter comprises:

a complex to real/imaginary converter for converting the first rotated error signal into real and imaginary components;

a multiplexer, coupled to the complex to real/imaginary converter, for selecting the imaginary component when the QAM signal is received and no signal when the VSB or the OQAM signal is received; and a make complex converter, coupled to the complex to real/imaginary converter and the multiplexer, for converting the real component and selected signal into the control signal for the passband adaptive equalizer.

18. The receiver of claim 16 wherein the second signal converter comprises:

a delay for delaying said multiplexer output signal;

a complex to real/imaginary converter, coupled to said delay, for converting the delayed signal into real and imaginary components;

a multiplexer, coupled to the complex to real/imaginary converter, for selecting the imaginary component when the QAM signal is received and no signal when the VSB or OQAM signal is received; and a make complex converter, coupled to the complex to real/imaginary converter and the multiplexer, for converting the real component and selected signal into the input signal for the DFE.

19. A signal processing apparatus for processing a passband signal to produce an equalized signal, said signal processing apparatus comprising:

a passband adaptive equalizer, containing a passband feed forward equalizer (FFE) and a passband decision feedback equalizer (DFE), for processing said passband signal to produce said equalized signal;

an equalizer control circuit, coupled to said passband adaptive equalizer, for initializing and updating filter coefficients of said passband adaptive equalizer;

a derotator, coupled to said passband adaptive equalizer and said equalizer control circuit, for derotating said equalized signal to form a baseband signal; and a quantizer, coupled to said derotator and said equalizer control circuit, for quantizing said baseband signal to produce quantized symbols;

said equalizer control circuit causing said decision feedback equalizer to operate in one of a decision feedback mode and a infinite impulse response (IIR) mode.

20. The signal processing apparatus of claim 19, wherein said quantizer operates in one of a quadrant mode, an octant mode and a decision directed mode, and said equalizer control circuit causes said decision feedback equalizer to operate in said decision feedback mode when said quantizer operates in said decision directed mode.

* * * * *